(12) United States Patent
Kim

(10) Patent No.: US 11,886,289 B2
(45) Date of Patent: Jan. 30, 2024

(54) DISPLAY DEVICE

(71) Applicant: Samsung Display Co., Ltd., Yongin-si (KR)

(72) Inventor: Sang Kuk Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/942,616

(22) Filed: Sep. 12, 2022

(65) Prior Publication Data

US 2023/0147347 A1 May 11, 2023

(30) Foreign Application Priority Data

Nov. 11, 2021 (KR) .................. 10-2021-0155201

(51) Int. Cl.
| | | |
|---|---|---|
| H03M 13/11 | (2006.01) | |
| H03M 13/00 | (2006.01) | |
| H03M 13/03 | (2006.01) | |
| H04L 1/1812 | (2023.01) | |
| H04L 1/00 | (2006.01) | |
| G06F 11/10 | (2006.01) | |
| G11C 11/56 | (2006.01) | |

(52) U.S. Cl.
CPC ...... G06F 11/1048 (2013.01); G06F 11/1044 (2013.01); G11C 11/5642 (2013.01)

(58) Field of Classification Search
CPC ............. G06F 11/1048; G06F 11/1044; G09G 3/3225; G09G 3/3266; G09G 3/3275; G09G 3/3674; G09G 3/3685; G11C 11/5642
See application file for complete search history.

(56) References Cited

U.S. PATENT DOCUMENTS

| | | | | |
|---|---|---|---|---|
| 8,418,028 | B2* | 4/2013 | Yamaga | H03M 13/1545 |
| | | | | 714/763 |
| 9,438,350 | B1* | 9/2016 | Schmidt | H04B 10/50572 |
| 2016/0378597 | A1* | 12/2016 | Chung | G11C 29/52 |
| | | | | 714/764 |
| 2018/0053545 | A1* | 2/2018 | Son | G11C 7/08 |
| 2022/0291845 | A1* | 9/2022 | Kasai | G11C 16/3404 |

FOREIGN PATENT DOCUMENTS

| | | |
|---|---|---|
| KR | 102025880 B1 | 9/2019 |
| KR | 102083498 B1 | 4/2020 |
| KR | 1020200037090 A | 4/2020 |

* cited by examiner

*Primary Examiner* — Guy J Lamarre
(74) *Attorney, Agent, or Firm* — CANTOR COLBURN LLP

(57) ABSTRACT

A display device includes an external memory device which stores a first integrated circuit ("IC") driving information, an internal memory device which stores a second IC driving information generated by copying the first IC driving information, a buffer which receives the second IC driving information and detects an electrostatic discharge current, an error correction code calculator which determines a first error correction code of the first IC driving information and a second error correction code of the second IC driving information when the electrostatic discharge current is detected, and an error correction code comparator which compares the first error correction code and the second error correction code. The internal memory device selectively updates the second IC driving information to the first IC driving information based on a result of a comparison of the first error correction code and the second error correction code.

20 Claims, 9 Drawing Sheets

BA:BA1,BA2,BA3
BB:BB1,BB2,BB3
EDC:EDC1,EDC2,EDC3

DISPLAY DEVICE

This application claims priority to Korean Patent Application No. 10-2021-0155201, filed on Nov. 11, 2021, and all the benefits accruing therefrom under 35 U.S.C. § 119, the content of which in its entirety is herein incorporated by reference.

BACKGROUND

1. Field

Embodiments of the invention relate to a display device. More particularly, embodiments of the invention relate to a display device in which a soft fail thereof caused by electrostatic discharge is prevented.

2. Description of the Related Art

Generally, a display device may include a display panel, a driving controller, gate driver, and a data driver. The display panel may include a plurality of gate lines, a plurality of data lines, and a plurality of pixels electrically connected to the gate lines and the data lines. The gate driver may provide gate signals to the gate lines. The data driver may provide data voltages to the data lines. The driving controller may control the gate driver and the data driver.

The display device may include an internal memory device that copies and stores data stored in an external memory device when the display device is powered on or sleeps out, and when there is data previously copied from the external memory device, the existing data copied from the external memory device may be updated.

SUMMARY

In a display device including an internal memory, when an electrostatic discharge current is generated by electrostatic discharge in the display device, a soft fail of the internal memory device may occur. In a display device, where the internal memory device inputs an integrated circuit ("IC") driving information, the inputted IC driving information may be contaminated by the electrostatic discharge current. In such a display device, the IC driving information stored in the internal memory device may be contaminated by the electrostatic discharge current.

Embodiments of the invention provide a display device comparing a first IC driving information stored in an internal memory device and a second IC driving information stored in an external memory device when an electrostatic discharge current is detected, and updating a second IC driving information to the first IC driving information based on a comparison result.

Embodiments of the invention also provide a display device comparing a first IC driving information stored in an internal memory device and a second IC driving information stored in an external memory device when an electrostatic discharge current is detected using a power clamp circuit, and updating a second IC driving information to the first IC driving information based on a comparison result.

According to an embodiment of the invention, a display device includes an external memory device disposed on a printed circuit board region and configured to store a first IC driving information, an internal memory device disposed in an IC region and configured to store a second IC driving information generated by copying the first IC driving information, a buffer disposed in the IC region and configured to receive the second IC driving information and to detect an electrostatic discharge current, an error correction code calculator disposed in the IC region and configured to determine a first error correction code of the first IC driving information and a second error correction code of the second IC driving information when the electrostatic discharge current is detected, and an error correction code comparator disposed in the IC region and configured to compare the first error correction code and the second error correction code. In such an embodiment, the internal memory device selectively updates the second IC driving information to the first IC driving information based on a comparison result of the first error correction code and the second error correction code.

In an embodiment, the display device may further include a display panel including pixels, a gate driver applying gate signals to the pixels, a data driver disposed in the IC region, comprising the buffer, and configured to apply data voltages to the pixels, and a driving controller disposed in the IC region, including the error correction code calculator and the error correction code comparator, and configured to control the gate driver and the data driver.

In an embodiment, the internal memory device may be configured to update the second IC driving information to the first IC driving information when the first error correction code and the second error correction code are different from each other.

In an embodiment, the internal memory device may be configured to update the second IC driving information to the first IC driving information when the display device is powered on or sleeps out.

In an embodiment, the error correction code calculator may be configured to determine the second error correction code when the error correction code calculator receives an update signal from a host processor.

In an embodiment, the buffer may include a plurality of buffer regions, and each of the buffer regions may include a buffer block configured to receive the second IC driving information and an electrostatic discharge detection circuit configured to detect the electrostatic discharge current.

In an embodiment, the error correction code calculator may be configured to determine the second error correction code of the second IC driving information for the buffer regions in which the electrostatic discharge current is detected, the error correction code comparator may be configured to compare the first error correction code of the first IC driving information for the buffer regions in which the electrostatic discharge current is detected and the second error correction code of the second IC driving information for the buffer regions in which the electrostatic discharge current is detected, and the internal memory device may be configured to update the second IC driving information for the buffer regions in which the electrostatic discharge current is detected to the first IC driving information for the buffer regions in which the electrostatic discharge current is detected when the first error correction code of the first IC driving information for the buffer regions in which the electrostatic discharge current is detected and the second error correction code of the second IC driving information for the buffer regions in which the electrostatic discharge current is detected are different from each other.

In an embodiment, the electrostatic discharge detection circuit may include a first resistor including a first electrode configured to receive a first memory voltage applied to the internal memory device and a second electrode connected to a first capacitor, a second resistor including a first electrode connected to the first capacitor and a second electrode configured to receive a second memory voltage applied to the internal memory device, the first capacitor including a first electrode connected to the second electrode of the first resistor and a second electrode connected to the first electrode of the second resistor, a third resistor including a first electrode connected to the first electrode of the second resistor and a second electrode connected to a comparator, and the comparator including a first input terminal connected to the third resistor, a second input terminal configured to receive an analog voltage, and an output terminal connected to the error correction code calculator.

In an embodiment, the error correction code calculator may be configured to determine the second error correction code of the second IC driving information for the buffer regions determined according to an update signal when the update signal is received from the host processor.

In an embodiment, the buffer may include a first buffer region, a second buffer region, and a third buffer region, the first buffer region may include a first buffer block and a first electrostatic discharge detection circuit adjacent to the first buffer block and the second buffer block, the second buffer region may include the second buffer block adjacent to the first buffer block and a second electrostatic discharge detection circuit adjacent to the second buffer block, and the third buffer region may include a third buffer block adjacent to the second buffer block and a third electrostatic discharge detection circuit adjacent to the second buffer block and the third buffer block.

In an embodiment, the error correction code calculator may be configured to determine the second error correction code of the second IC driving information for the first buffer region and the second buffer region when the electrostatic discharge current is detected in the first buffer region, to determine the second error correction code of the second IC driving information for the second buffer region when the electrostatic discharge current is detected in the second buffer region, and to determine the second error correction code of the second IC driving information for the second buffer region and the third buffer region when the electrostatic discharge current is detected in the third buffer region.

In an embodiment, the error correction code calculator may include a time delay buffer configured to receive a detection signal from the buffer and to delay the detection signal, and an error correction code calculating circuit configured to receive the detection signal from the time delay buffer and to determine the first error correction code of the first IC driving information and the second error correction code of the second IC driving information in respond to the detection signal.

In an embodiment, the first error correction code may be a checksum value of the first IC driving information, and the second error correction code may be a checksum value of the second IC driving information.

According to an embodiment of the invention, a display device includes an external memory device disposed on a printed circuit board region and configured to store a first IC driving information, an internal memory device disposed in an IC region, configured to store a second IC driving information generated by copying the first IC driving information, including power clamp circuit configured to detect an electrostatic discharge current, a buffer disposed in the IC region and configured to receive the second IC driving information, an error correction code calculator disposed in the IC region and configured to determine a first error correction code of the first IC driving information and a second error correction code of the second IC driving information when the electrostatic discharge current is detected, and an error correction code comparator disposed in the IC region and configured to compare the first error correction code and the second error correction code. In such an embodiment, the internal memory device selectively updates the second IC driving information to the first IC driving information based on a comparison result of the first error correction code and the second error correction code.

In an embodiment, the power clamp circuit may include a detector configured to detect the electrostatic discharge current, a discharger configured to provide a discharge path for the electrostatic discharge current, and a control circuit configured to control the discharger.

In an embodiment, the detector may include a fourth resistor including a first electrode configured to receive a first memory voltage applied to the internal memory device and a second electrode connected to a second capacitor, and the second capacitor including a first electrode connected to the second electrode of the fourth resistor and a second electrode configure to receive a second memory voltage applied to the internal memory device. The discharger may include a discharge transistor including a control electrode connected to the control circuit, a first electrode configure to receive the first memory voltage, and a second electrode configure to receive the second memory voltage, and the control circuit may include an inverter including a first electrode connected to the first electrode of the second capacitor and a second electrode connected to the control electrode of the discharge transistor.

In an embodiment, the internal memory device may be configured to update the second IC driving information to the first IC driving information when the first error correction code and the second error correction code are different from each other.

In an embodiment, the internal memory device may be configured to update the second IC driving information to the first IC driving information when the display device is powered-on or sleep-out.

In an embodiment, the error correction code calculator may be configured to determine the second error correction code when the error correction code calculator receives an update signal from a host processor.

In an embodiment, the first error correction code may be a checksum value of the first IC driving information, and the second error correction code may be a checksum value of the second IC driving information.

In embodiments of the invention, the display device may prevent a soft fail of an internal memory device generated by an electrostatic discharge, contamination of a second IC driving information applied to a buffer, and contamination of a second IC driving information stored in the internal memory device by including an external memory device disposed on a printed circuit board region and configured to store first IC driving information, the internal memory device disposed in an IC region and configured to store the second IC driving information generated by copying the first IC driving information, the buffer disposed in the IC region and configured to receive the second IC driving information and to detect an electrostatic discharge current, an error correction code calculator disposed in the IC region and configured to determine a first error correction code of the first IC driving information and a second error correction code of the second IC driving information when the electrostatic discharge current is detected, and an error correction code comparator disposed in the IC region and configured to compare the first error correction code and the second error correction code, and selectively updating the second IC driving information to the first IC driving information according to a comparison result of the first error correction code and the second error correction code.

In such embodiments, the display device may prevent a soft fail of an internal memory device generated by an electrostatic discharge without a separate electrostatic discharge detection circuit, contamination of a second IC driving information applied to a buffer, and contamination of a second IC driving information stored in an internal memory device by including an external memory device disposed on a printed circuit board region and configured to store a first IC driving information, the internal memory device disposed in an IC region, configured to store the second IC driving information generated by copying the first IC driving information, including power clamp circuit configured to detect an electrostatic discharge current, the buffer disposed in the IC region and configured to receive the second IC driving information, an error correction code calculator disposed in the IC region and configured to determine a first error correction code of the first IC driving information and a second error correction code of the second IC driving information when the electrostatic discharge current is detected, and an error correction code comparator disposed in the IC region and configured to compare the first error correction code and the second error correction code, and selectively updating the second IC driving information to the first IC driving information according to a comparison result of the first error correction code and the second error correction code.

DETAILED DESCRIPTION

Figure 1:
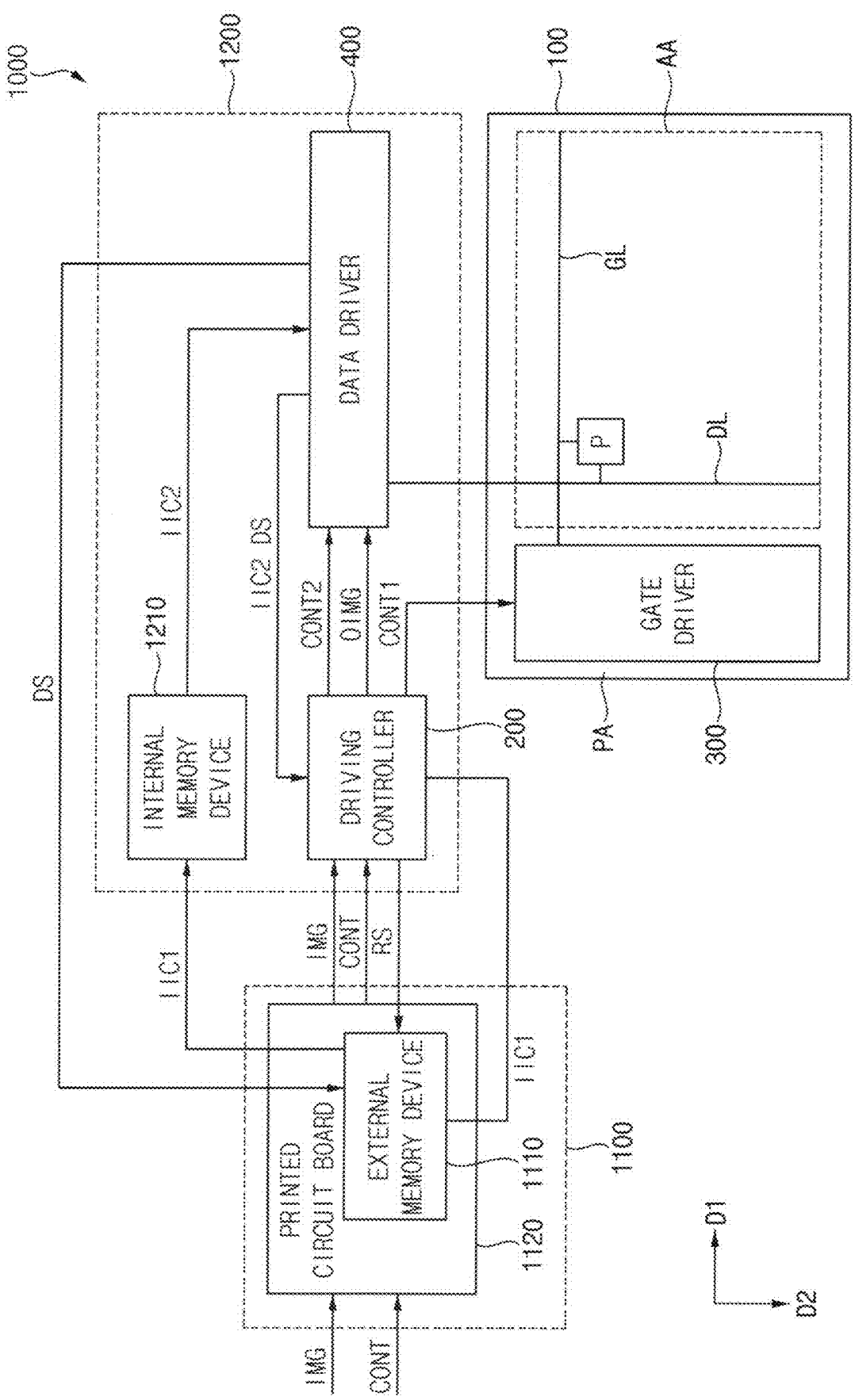
FIG. 1 is a block diagram illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a block diagram illustrating a display device 1000 according to embodiments of the invention.

Referring to FIG. 1, an embodiment of the display device 1000 may include a display panel 100, a driving controller 200, a gate driver 300, a data driver 400, an internal memory device 1210, and an external memory device 1110. The driving controller 200, the data driver 400, and the internal memory device 1210 may be disposed in an integrated circuit ("IC") region 1200. The external memory device 1110 may be disposed in a printed circuit board region 1100.

The printed circuit board region 1100 may be an region on a printed circuit board 1120. In an embodiment, for example, the printed circuit board 1120 may be a flexible printed circuit board. The printed circuit board 1120 may apply input image data IMG and an input control signal CONT received from a host processor (e.g., a graphic processing unit ("GPU")) to the driving controller 200.

The external memory device 1110 may store a first IC driving information IIC1. The first IC driving information IIC1 may include a compensation information for compensating a data voltage output to the data lines DL. The external memory device 1110 may apply the first IC driving information IIC1 to the internal memory device 1210. In an embodiment, the external memory device 1110 may apply the first IC driving information IIC1 to the internal memory device 1210 in response to a reloading signal RS. In an embodiment, the external memory device 1110 may apply the first IC driving information IIC1 to the driving controller 200 in response to a detection signal DS. In an embodiment, the external memory device 1110 may apply the first IC driving information IIC1 to the internal memory device 1210 when the display device 1000 is powered on or sleeps out. Accordingly, the external memory device 1110 may apply the first IC driving information IIC1 to the internal memory device 1210 when the display device 1000 is powered on or sleeps out, or when the external memory device 1110 receives the reloading signal RS.

In an embodiment, for example, when the display device 1000 is powered on, power voltages for driving the display device 1000 may be applied. In an embodiment, for example, the power voltages for driving the display device 1000 may rise to a voltage level for driving the display device 1000 when the display device 1000 sleeps out. That is, after the display device 1000 is powered on, the display device 1000 may lower a voltage levels of the power voltages for driving the display device 1000 (i.e., sleep in) or raise the voltage levels of the power voltages for driving the display device 1000 (i.e., sleep out).

The IC region 1200 may include a chip in which the driving controller 200 and the data driver 400 are integrated. In an embodiment, for example, the IC region 1200 may include a single chip in which the driving controller 200, the data driver 400, and the internal memory device 1210 are integrated. In an embodiment, for example, in the IC region 1200, the chip may be mounted in a chip on glass ("COG"), a chip on film ("COF"), or a chip on plastic ("COP") manner.

The display panel 100 includes a display region AA on which an image is displayed and a peripheral region PA adjacent to the display region AA. According to an embodiment, the gate driver 300 may be integrated on the peripheral region PA of the display panel 100.

The display panel 100 may include a plurality of gate lines GL, a plurality of data lines DL, and a plurality of pixels P electrically connected to the data lines DL and the gate lines GL. The gate lines GL may extend in a first direction D1 and the data lines DL may extend in a second direction D2 crossing the first direction D1.

The driving controller 200 may receive the input image data IMG and the input control signal CONT from a host processor (e.g., a GPU) through the printed circuit board 1120. In an embodiment, for example, the input image data IMG may include red image data, green image data and blue image data. According to an embodiment, the input image data IMG may further include white image data. In an alternative embodiment, for example, the input image data IMG may include magenta image data, yellow image data, and cyan image data. The input control signal CONT may include a master clock signal and a data enable signal. The input control signal CONT may further include a vertical synchronizing signal and a horizontal synchronizing signal. In an embodiment, the driving controller 200 may generate the reloading signal RS based on the first IC driving information IIC1, the second IC driving information IIC2, and the detection signal DS.

The driving controller 200 may generate a first control signal CONT1, a second control signal CONT2, and output image data OIMG based on the input image data IMG and the input control signal CONT.

The driving controller 200 may generate the first control signal CONT1 for controlling operation of the gate driver 300 based on the input control signal CONT and output the first control signal CONT1 to the gate driver 300. The first control signal CONT1 may include a vertical start signal and a gate clock signal.

The driving controller 200 may generate the second control signal CONT2 for controlling operation of the data driver 400 based on the input control signal CONT and output the second control signal CONT2 to the data driver 400. The second control signal CONT2 may include a horizontal start signal and a load signal.

The driving controller 200 may receive the input image data IMG and the input control signal CONT, and generate the output image data OIMG. The driving controller 200 may output the output image data OIMG to the data driver 400.

The gate driver 300 may generate gate signals for driving the gate lines GL in response to the first control signal CONT1 received from the driving controller 200. The gate driver 300 may output the gate signals to the gate lines GL. In an embodiment, for example, the gate driver 300 may sequentially output the gate signals to the gate lines GL.

The data driver 400 may receive the second control signal CONT2 and the output image data OIMG from the driving controller 200. The data driver 400 may receive the second IC driving information IIC2 from the internal memory device 1210. The data driver 400 may convert the output image data OIMG into data voltages having an analog type and generate the data voltages based on the output image data converted to an analog voltage and the second IC driving information IIC2. The data driver 400 may output the data voltage to the data lines DL.

The data driver 400 may apply the second IC driving device received from the internal memory device 1210 to the driving controller 200. The data driver 400 may detect an electrostatic discharge current generated by electrostatic discharge and generate the detection signal DS. The data driver 400 may apply the detection signal DS to the driving controller 200 and the external memory device 1110.

The internal memory device 1210 may generate the second IC driving information IIC2 by copying the first IC driving information IIC1, and may store the second IC driving information IIC2. In such an embodiment, the second IC driving information IIC2 may also include the compensation information. The internal memory device 1210 may apply the second IC driving information IIC2 to the data driver 400. A first memory voltage and a second memory voltage for driving the internal memory device 1210 may be applied to the internal memory device 1210. In an embodiment, for example, the first memory voltage may have a high voltage level, and the second memory voltage may have a low voltage level.

In an embodiment, for example, the internal memory device 1210 may generate the second IC driving information IIC2 by copying the first IC driving information IIC1 when the display device 1000 is first powered on. In an embodiment, for example, after generating the second IC driving information IIC2, the internal memory device 1210 may update the second IC driving information to the first IC driving information by receiving the first IC driving information when the display device 1000 is powered on or sleeps out. In an embodiment, when the external memory device 1110 applies the first IC driving information IIC1 to the internal memory device 1210 in response to the reloading signal RS, the internal memory device 1210 may update the second IC driving information to the first IC driving information.

Figure 2:
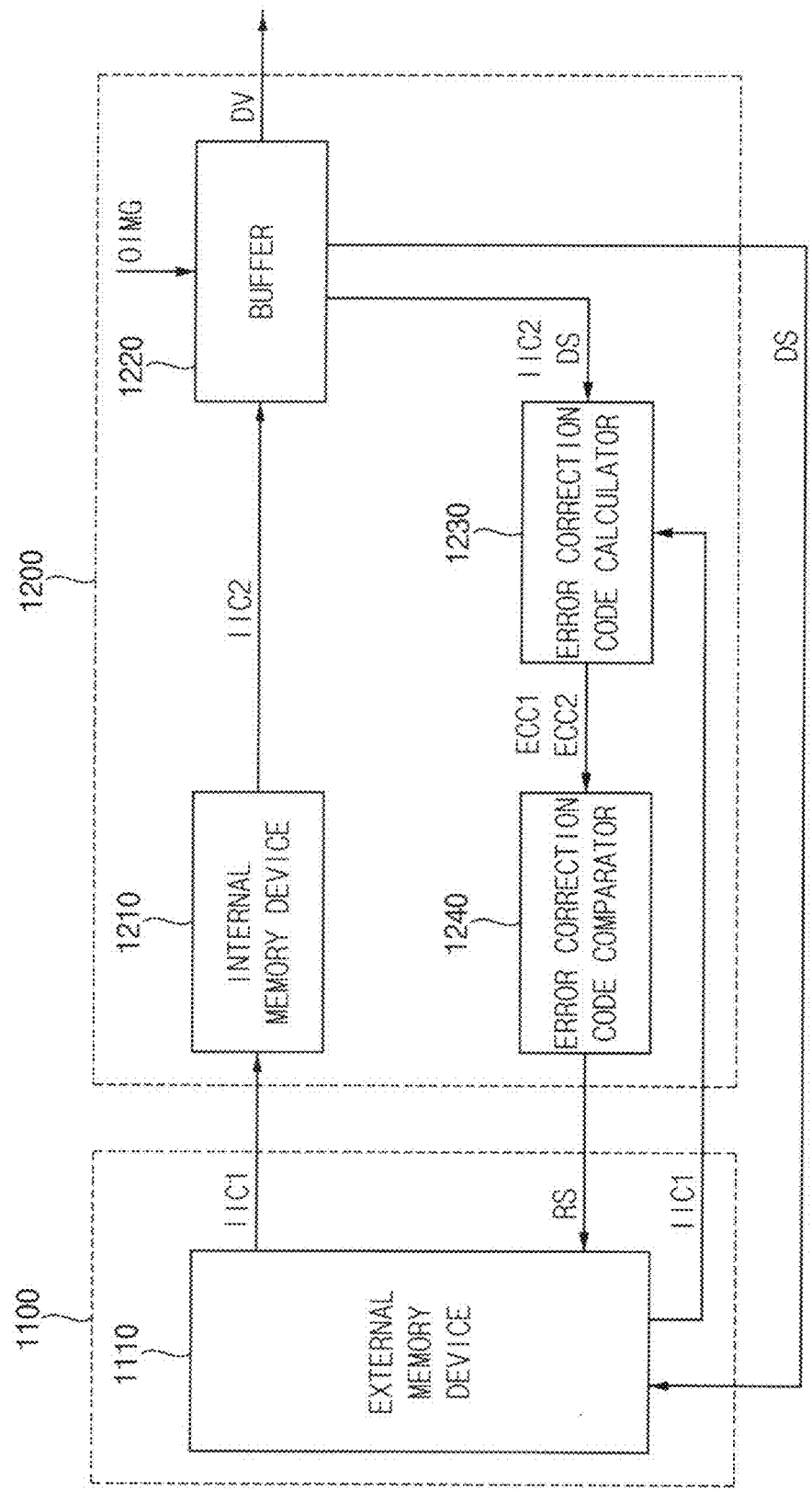
FIG. 2 is a block diagram illustrating an embodiment of a printed circuit board region and an IC region of the display device of FIG. 1.
Figure 3:
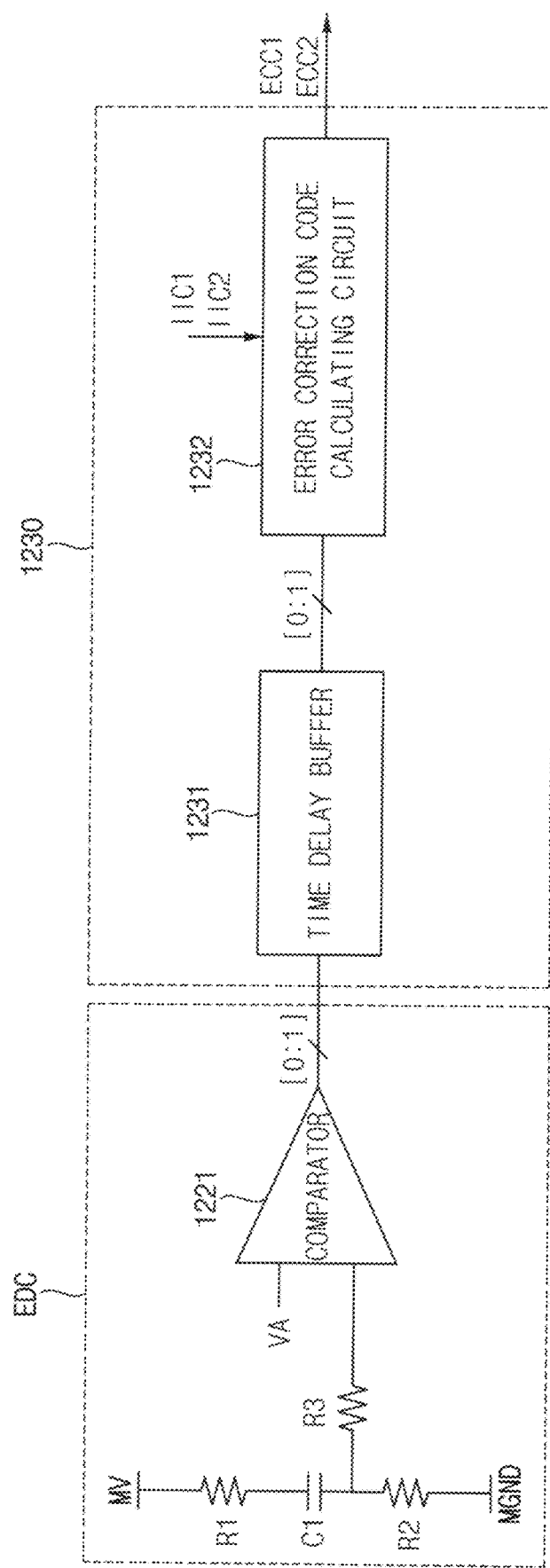
FIG. 3 is a circuit diagram illustrating an embodiment of an electrostatic discharge detection circuit and an error correction code calculator of the display device of FIG. 1.

FIG. 2 is a block diagram illustrating an embodiment of the printed circuit board region 1100 and the IC region 1200 of the display device 1000 of FIG. 1, and FIG. 3 is a circuit diagram illustrating an embodiment of an electrostatic discharge detection circuit EDC and an error correction code calculator 1230 of the display device of FIG. 1.

Referring to FIGS. 2 and 3, an embodiment of the display device 1000 may include the external memory device 1110 disposed on the printed circuit board region 1100 and the external memory device 1110 stores the first IC driving information IIC1. The display device 1000 may include the internal memory device 1210 disposed in the IC region and the internal memory device 1210 stores the second IC driving information IIC2 generated by copying the first IC driving information IIC1. The display device 1000 may include a buffer 1220 disposed in the IC region 1200 and the buffer 1220 receives the second IC driving information and detects the electrostatic discharge current. The display device 1000 may include the error correction code calculator 1230 disposed in the IC region 1200 and the error correction code calculator 1230 determines a first error correction code ECC1 of the first IC driving information ICC1 and a second error correction code ECC2 of the second IC driving information ICC2 when the electrostatic discharge current is detected. The display device 1000 may include an error correction code comparator 1240 disposed in the IC region 1200 and the error correction code comparator 1240 compares the first error correction code ECC1 and the second error correction code ECC2. The internal memory device 1210 may update the second IC driving information ICC2 to the first IC driving information ICC1 based on a result a comparison of the first error correction code ECC1 and the second error correction code ECC2.

The driving controller 200 may include the error correction code calculator 1230 and the error correction code comparator 1240, and the data driver 400 may include the buffer 1220.

The buffer 1220 may receive the second IC driving information IIC2 and detect the electrostatic discharge current. The buffer 1220 may include the electrostatic discharge detection circuit EDC that detects the electrostatic discharge current.

The buffer 1220 may receive the second IC driving information IIC2 and compensate the output image data OIMG converted to an analog voltage based on the second IC driving information IIC2 to generate the data voltage DV. The buffer 1220 may apply the second IC driving information IIC2 received from the internal memory device 1210 to the error correction code calculator 1230.

The electrostatic discharge detection circuit EDC may include a first resistor R1 including a first electrode that receives the first memory voltage MV applied to the internal memory device 1210 and a second electrode connected to a first capacitor C1, a second resistor R2 including a first electrode connected to the first capacitor C1 and a second electrode that receives the second memory voltage MGND applied to the internal memory device 1210, the first capacitor C1 including a first electrode connected to the second electrode of the first resistor R1 and a second electrode connected to the first electrode of the second resistor R2, a third resistor R3 including a first electrode connected to the first electrode of the second resistor R2 and a second electrode connected to a comparator 1221, and the comparator 1221 including a first input terminal connected to the third resistor R3, a second input terminal that receives an analog voltage VA, and an output terminal connected to the error correction code calculator 1230.

In an embodiment, for example, when the electrostatic discharge current flows into a line to which the second memory voltage MGND is applied, a voltage of the second electrode of the second resistor R2 may increase. Accordingly, a voltage of the first input terminal of the comparator 1221 may increase. The comparator 1221 may output the detection signal DS having a value of 1 when a voltage of the first input terminal of the comparator 1221 is greater than the analog voltage VA, and output the detection signal DS having a value of 0 when the voltage of the first input terminal of the comparator 1221 is less than the analog voltage VA. Accordingly, when the voltage of the first input terminal of the comparator 1221 is greater than the analog voltage VA due to the electrostatic discharge current, the comparator 1221 may output the detection signal DS having a value of 1. When the error correction code calculator 1230 receives the detection signal DS having a value of 1 (i.e., when an electrostatic discharge current is detected), the error correction code calculator 1230 may determine the first error correction code ECC1 of the first IC driving information IIC1, and the second error correction code ECC2 of the second IC driving information IIC2. The analog voltage VA may be determined to be an appropriate value for detecting the electrostatic discharge current. In an embodiment, the output terminal of the comparator 1221 is connected to the external memory device 1110, and when the external memory device 1110 receives the detection signal DS having a value of 1, the external memory device 1110 may output the first IC driving information IIC1 to the error correction code calculator 1230 and the internal memory device 1210.

When the electrostatic discharge current is detected, the error correction code calculator 1230 may determine the first error correction code ECC1 of the first IC driving information IIC1 and the second error correction code ECC2 of the second IC driving information IIC2. In an embodiment, for example, the error correction code calculator 1230 may receive the detection signal DS from the buffer 1220, and the error correction code calculator 1230 may include a time delay buffer 1231 that receives the detection signal DS from the buffer 1220 and delays the detection signal DS and an error correction code calculating circuit 1232 that receives the detection signal DS from the time delay buffer and determines the first error correction code ECC1 of the first IC driving information IIC1 and the second error correction code ECC2 of the second IC driving information IIC2 in respond to the detection signal DS.

In an embodiment, for example, the time delay buffer 1231 may temporarily store and output the detection signal DS. Accordingly, the error correction code calculating circuit 1232 may receive the detection signal DS after the electrostatic discharge current passes, and calculate the first error correction code ECC1 and the second error correction code ECC2 in response to the detection signal DS. The error correction code calculating circuit 1232 may receive the second IC driving information IIC2 from the buffer 1220 and receive the first IC driving information IIC1 from the external memory device 1110.

The first error correction code ECC1 and the second error correction code ECC2 may have values for checking whether the values of the first IC driving information IIC1 and the second IC driving information IIC2 are the same as each other. In an embodiment, for example, the first error correction code ECC1 may be a checksum value of the first IC driving information IIC1, and the second error correction code ECC2 may be a checksum value of the second IC driving information IIC2. However, the first error correction code ECC1 and the second error correction code ECC2 are not limited thereto, and alternatively, the first error correction code ECC1 and the second error correction code ECC2 may include any form for comparing values of the first IC driving information IIC1 and the second IC driving information IIC2.

The error correction code comparator 1240 may compare the first error correction code ECC1 and the second error correction code ECC2. When the first error correction code ECC1 and the second error correction code ECC2 are different from each other, the internal memory device 1210 may update the second IC driving information IIC2 to the first IC driving information IIC1.

In an embodiment, for example, the error correction code comparator 1240 may apply the reloading signal RS to the external memory device 1110 when the first error correction code ECC1 and the second error correction code ECC2 are different from each other. When the reloading signal RS is applied, the external memory device 1110 may apply the first IC driving information IIC1 to the internal memory device 1210. When the internal memory device 1210 receives the first IC driving information IIC1 from the external memory device 1110, the internal memory device 1210 may update the second IC driving information IIC2 to the first IC driving information IIC1. When a soft fail occurs in the internal memory device 1210 due to the electrostatic discharge current, the second IC driving information IIC2 may be contaminated by the electrostatic discharge current when the internal memory device 1210 input the second IC driving information IIC2, or the second IC driving information IIC2 stored in the internal memory device 1210 may be contaminated by the electrostatic discharge current, the first IC driving information IIC1 and the second IC driving information IIC2 may be different from each other (i.e., the first error correction code ECC1 and the second error correction code ECC2 may be different from each other). That is, when the first IC driving information IIC1 and the second IC driving information IIC2 are different from each other due to the electrostatic discharge current, the internal memory device 1210 may prevent contamination of the second IC driving information IIC2 by updating the second IC driving information to the first IC driving information FIG. 4 is a block diagram illustrating an embodiment of the printed circuit board region 1100 and the IC region 1200 of a display device according the invention.

Figure 4:
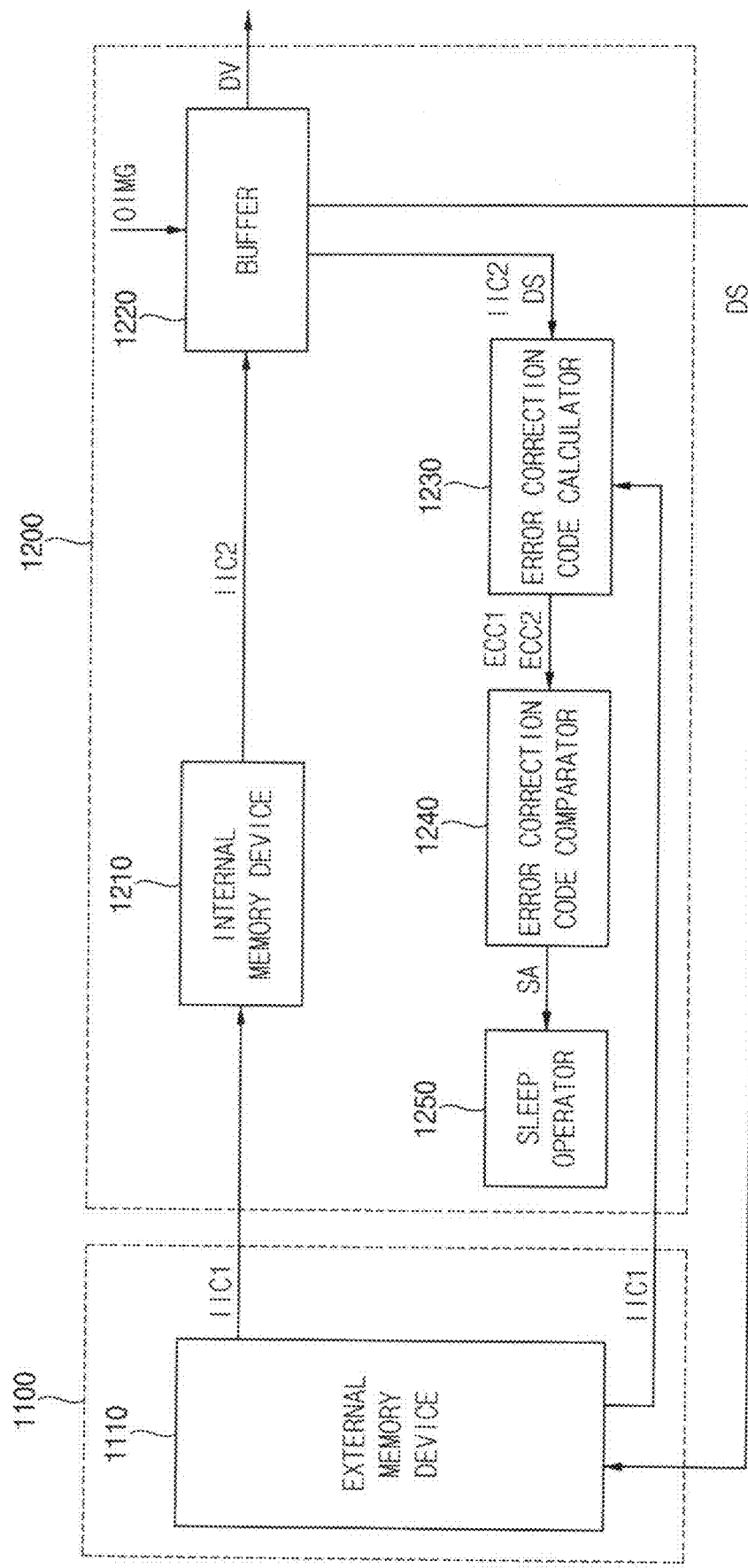
FIG. 4 is a block diagram illustrating an embodiment of a printed circuit board region and an IC region of a display device the invention.

The display device of FIG. 4 is substantially the same as the display device 1000 of FIG. 1 except for the error correction code comparator 1240 and a sleep operator 1250. Thus, the same reference numerals are used to refer to the same or similar element, and any repetitive detailed description thereof will be omitted.

Referring to FIG. 4, in an embodiment, the error correction code comparator 1240 may apply a sleep in/out signal SA to the sleep operator 1250 when the first error correction code ECC1 and the second error correction code ECC2 are different from each other. The sleep operator 1250 may sleep in the display device in response to the sleep in/out signal SA and then may sleep out. As described above, when the display device sleeps out, the external memory device 1110 may apply the first IC driving information IIC1 to the internal memory device 1210, and the internal memory device 1210 may update the second IC driving information IIC2 to the first IC driving information IIC1.

Figure 5:
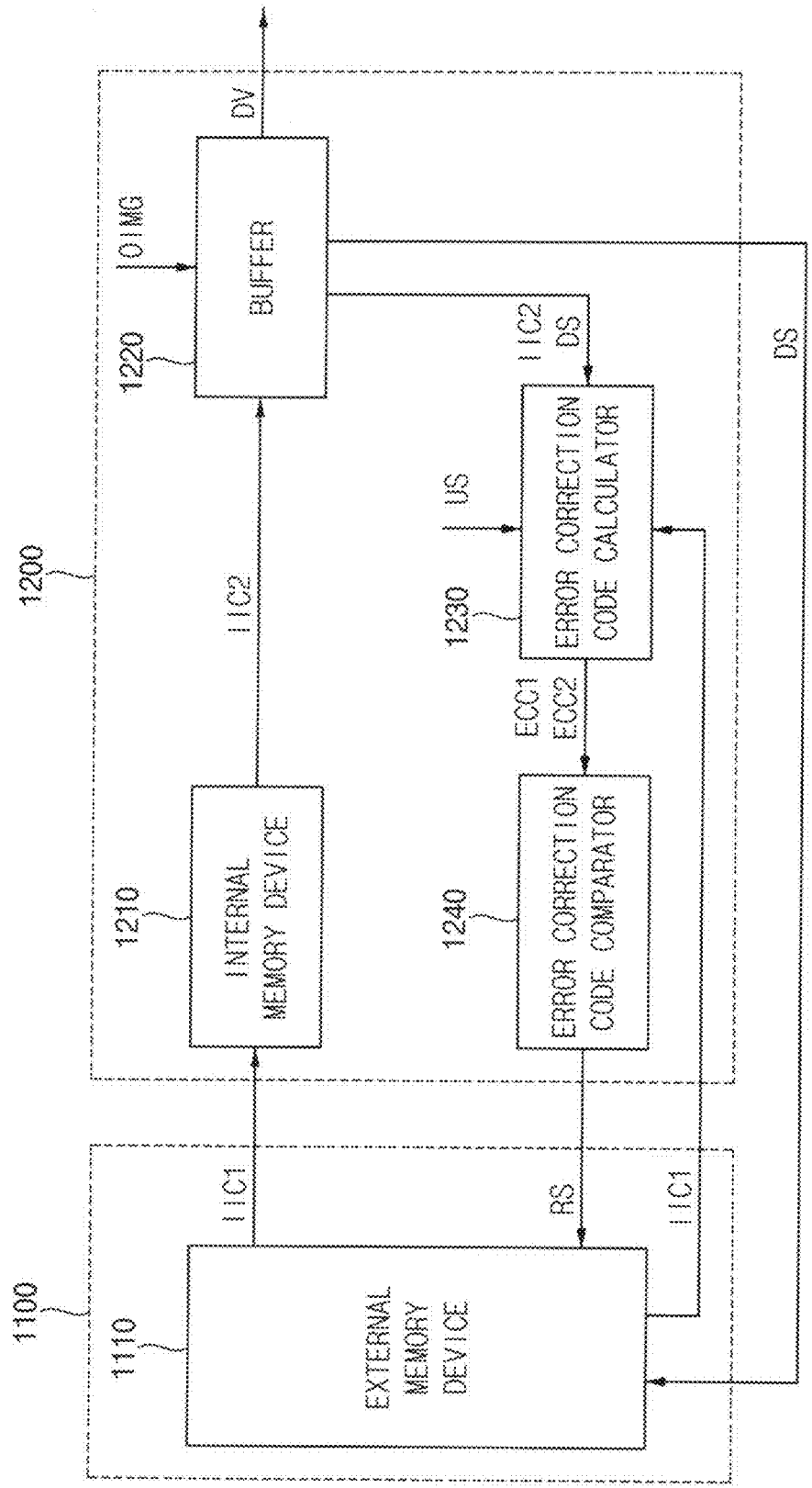
FIG. 5 is a block diagram illustrating an embodiment of a printed circuit board region and an IC region of a display device according to the invention.

FIG. 5 is a block diagram illustrating an embodiment of the printed circuit board region 1100 and the IC region 1200 of a display device according to the invention.

The display device of FIG. 5 is substantially the same as the display device 1000 of FIG. 1 except for an operation by a update signal US. Thus, the same reference numerals are used to refer to the same or similar element, and any repetitive detailed description thereof will be omitted.

Referring to FIG. 5, in an embodiment, the error correction code calculator 1230 may determine the second error correction code ECC2 when the error correction code calculator 1230 receives the update signal US from the host processor. When the error correction code calculator 1230 receives the update signal US, the error correction code calculator 1230 may determine the second error correction code ECC2 regardless of whether the electrostatic discharge current is detected. The error correction code comparator 1240 may apply the reloading signal RS to the external memory device 1110 when the first error correction code ECC1 and the second error correction code ECC2 are different from each other. That is, the display device may compare the first IC driving information IIC1 and the second IC driving information IIC2 regardless of whether the electrostatic discharge current is detected when the display device receives the update signal US from the host processor, and may update the second IC driving information IIC2 based on a result of a comparison of the first IC driving information IIC1 and the second IC driving information IIC2.

Figure 6:
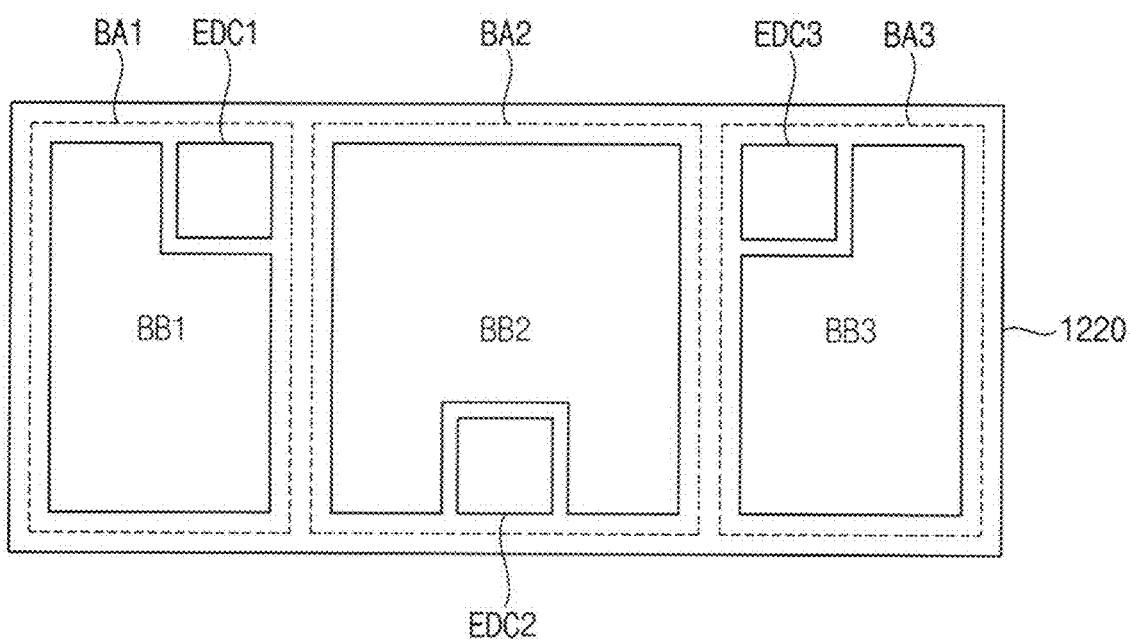
FIG. 6 is a diagram illustrating an embodiment of a buffer of a display device according to the invention.

FIG. 6 is a diagram illustrating an embodiment of the buffer 1220 of a display device according to the invention.

The display device of FIG. 6 is substantially the same as the display device 1000 of FIG. 1 except for separating the second IC driving information IIC2 into the second IC driving information IIC2 for each of buffer regions BA. Thus, the same reference numerals are used to refer to the same or similar element, and any repetitive detailed description thereof will be omitted.

Referring to FIGS. 2 and 6, in an embodiment, the buffer 1220 may include a plurality of buffer regions BA, a buffer block BB that receives the second IC driving information IIC2 from each of the buffer regions BA, and the electrostatic discharge detection circuit EDC that detects the electrostatic discharge current.

The buffer blocks BB may receive the second IC driving information IIC2, and compensate the output image data OIMG converted to an analog voltage based on the second IC driving information IIC2 to generate the data voltage DV. The buffer blocks BB may apply the second IC driving information IIC2 received from the internal memory device 1210 to the error correction code calculator 1230.

The second IC driving information IIC2 may have a different value for each of the buffer blocks BB. In such an embodiment, since not all pixels P of the display panel 100 are equally compensated, the second IC driving information IIC2 having a different value may be applied to each of the buffer blocks BB.

In an embodiment, the error correction code calculator 1230 may determine the second error correction code EC2 of the second IC driving information IIC2 for the buffer regions BA in which the electrostatic discharge current is detected (i.e., the buffer region BA including the electrostatic discharge detection circuit EDC in which the electrostatic discharge current is detected).

In an embodiment, for example, as shown in FIG. 6, the buffer 1220 may include a first buffer region BA1, a second buffer region BA2, and a third buffer region BA3, a first buffer region BA1 may include a first buffer block BB1 and a first electrostatic discharge detection circuit EDC1, the second buffer region BA2 may include a second buffer block BB2 and a second electrostatic discharge detection circuit EDC2, and the third buffer region BA3 may include a third buffer block BB3 and a third electrostatic discharge detection circuit EDC3. In an embodiment, the error correction code calculator 1230 may determine the second error correction code ECC2 of the second IC driving information for the first buffer region BA1 (i.e., the second IC driving information IIC2 applied to the first buffer block BB1) when the electrostatic discharge current is detected in the first buffer region BA1 (i.e., when the electrostatic discharge current is detected in the first electrostatic discharge detection circuit EDC1), the second error correction code ECC2 of the second IC driving information for the second buffer region BA2 (i.e., the second IC driving information IIC2 applied to the second buffer block BB2) when the electrostatic discharge current is detected in the second buffer region BA2 (i.e., when the electrostatic discharge current is detected in the second electrostatic discharge detection circuit EDC2), and the second error correction code ECC2 of the second IC driving information for the third buffer region BA3 (i.e., the second IC driving information IIC2 applied to the third buffer block BB3) when the electrostatic discharge current is detected in the third buffer region BA3 (i.e., when the electrostatic discharge current is detected in the third electrostatic discharge detection circuit EDC3).

The error correction code comparator 1240 may compare the first error correction code ECC1 of the first IC driving information IIC1 for the buffer regions BA in which the electrostatic discharge current is detected and the second error correction code ECC2 of the second IC driving information IIC2 for the buffer regions BA in which the electrostatic discharge current is detected. The error correction code comparator 1240 may apply the reloading signal RS to the external memory device 1110 when the first error correction code ECC1 of the first IC driving information IIC1 for the buffer regions BA in which the electrostatic discharge current is detected and the second error correction code ECC2 of the second IC driving information IIC2 for the buffer regions in which the electrostatic discharge current is detected are different from each other. The external memory device 1110 may apply the first IC driving information IIC1 for the buffer regions BA in which the electrostatic discharge current is detected to the internal memory device 1210 in response to the reloading signal RS. In such an embodiment, the internal memory device 1210 may update the second IC driving information IIC2 for the buffer regions BA in which the electrostatic discharge current is detected to the first IC driving information IIC1 for the buffer regions BA in which the electrostatic discharge current is detected when the first error correction code ECC1 of the first IC driving information IIC1 for the buffer regions BA in which the electrostatic discharge current is detected and the second error correction code ECC2 of the second IC driving information IIC2 for the buffer regions in which the electrostatic discharge current is detected are different from each other. Accordingly, only the second driving information IIC2 for the buffer regions BA in which the electrostatic discharge current is detected may be updated.

In an embodiment, for example, as shown in FIG. 6, the buffer 1220 may include the first buffer region BB1, the second buffer region BB2, and the third buffer region BB3, the first buffer region BA1 may include a first buffer block BB1 and the first electrostatic discharge detection circuit EDC1, the second buffer region BA2 may include the second buffer block BB2 and the second electrostatic discharge detection circuit EDC2, and the third buffer region BA3 may include the third buffer block BB3 and the third electrostatic discharge detection circuit EDC3. In such an embodiment, the error correction code calculator 1230 may determine the second IC driving information IIC2 for the first buffer region BA1 and the second buffer region BA2 when the electrostatic discharge current is detected in the first buffer region BA1, determine the second IC driving information IIC2 for the second buffer region BA2 when the electrostatic discharge current is detected in the second buffer region BA2, and determine the second IC driving information IIC2 for the second buffer region BA2 and the third buffer region BA3 when the electrostatic discharge current is detected in the third buffer region BA3. Accordingly, in such an embodiment, even when the electrostatic discharge current is not detected in an electrostatic discharge detection circuit EDC in a buffer region BA, the display device may update the second IC driving information IIC2 for the buffer region BA adjacent to an electrostatic discharge detection circuit EDC in which the electrostatic discharge current is detected Referring to FIGS. 5 and 6, in an embodiment, the error correction code calculator 1230 may determine the second error correction code ECC2 for the buffer regions BA determined by the update signal US when the error correction code calculator 1230 receives the update signal US from the host processor. The error correction code calculator 1230 may determine the second error correction code ECC2 of the second IC driving information for the buffer regions BA determined by the update signal US regardless of whether the electrostatic discharge current is detected in the buffer regions BA determined by the update signal US. The error correction code comparator 1240 may apply the reloading signal RS to the external memory device 1110 when the first error correction code ECC1 of the first IC driving information IIC1 for the buffer regions BA determined by the update signal US and the second error correction code ECC2 of the second IC driving information IIC2 for the buffer regions BA determined by the update signal US are different from each other. In such an embodiment, the display device may compare the first error correction code ECC1 of the first IC driving information IIC1 for the buffer regions BA determined by the update signal US and the second error correction code ECC2 of the second IC driving information IIC2 for the buffer regions BA determined by the update signal US when the display device receives the update signal US from the host processor, and may update the second IC driving information IIC2 for the buffer regions BA determined by the update signal US stored in the internal memory device 1210 based on a result of a comparison of the first IC driving information IIC1 and the second IC driving information IIC2.

Figure 7:
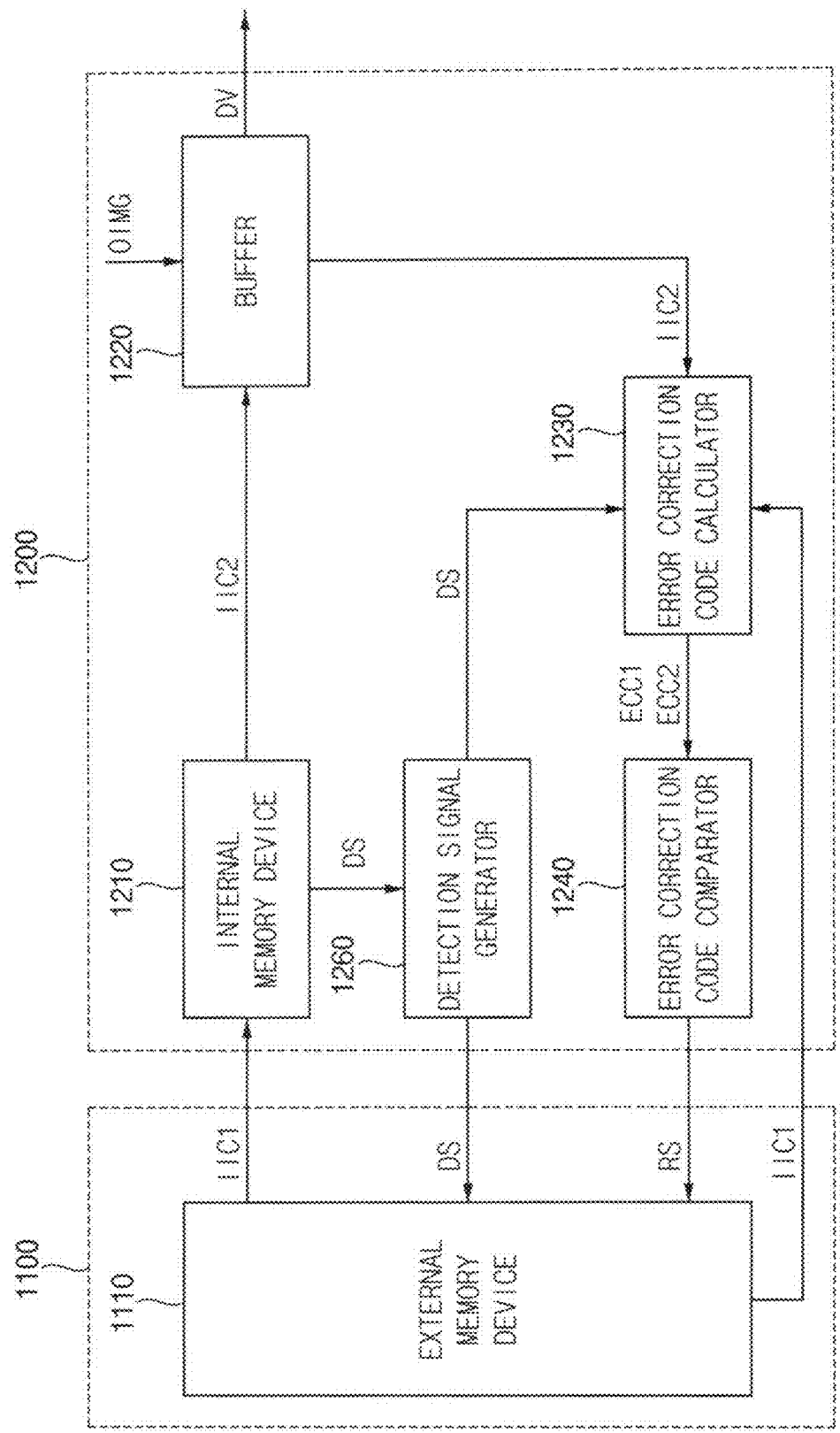
FIG. 7 is a block diagram illustrating a display device according to an embodiment of the invention.
Figure 8:
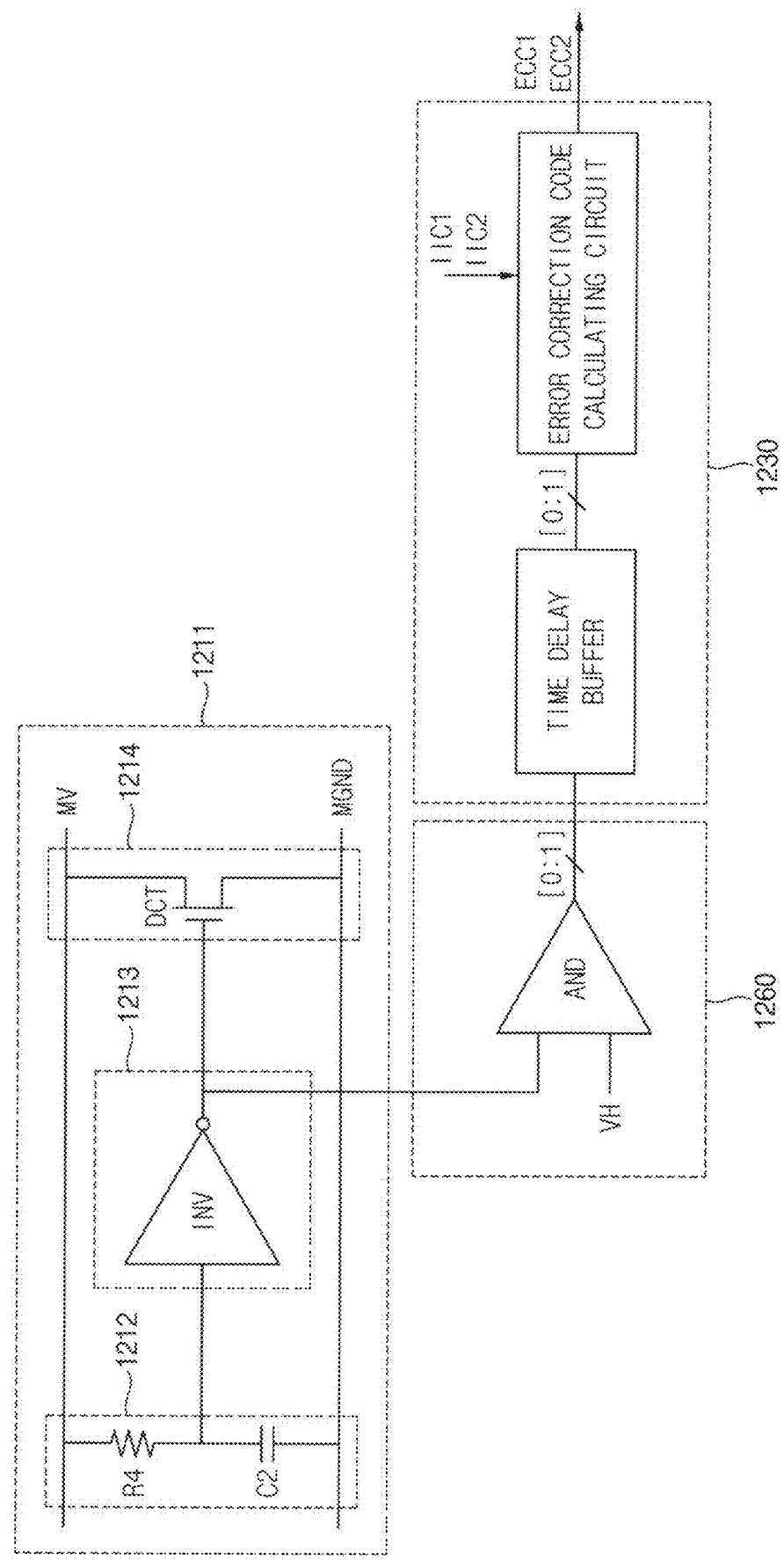
FIG. 8 is a circuit diagram illustrating an embodiment of a power clamp circuit, a detection signal generator, and an error correction code calculator of the display device of FIG. 7.

FIG. 7 is a block diagram illustrating a display device according to an embodiment of the invention, FIG. 8 is a circuit diagram illustrating an embodiment of a power clamp circuit 1211, a detection signal generator 1260, and the error correction code calculator 1230 of the display device of FIG. 7.

The display device of FIGS. 7 and 8 is substantially the same as the display device 1000 of FIG. 1 except for detecting the electrostatic discharge current. Thus, the same reference numerals are used to refer to the same or similar element, and any repetitive detailed description thereof will be omitted.

Referring to FIG. 7, an embodiment of the display device may include the internal memory device 1210 disposed in the IC region 1200. In such an embodiment, the internal memory device 1210 stores the second IC driving information IIC2 generated by copying the first IC driving information IIC1, and the internal memory device 1210 includes the power clamp circuit 1211 that detects the electrostatic discharge current. The display device may include the buffer 1220 disposed in the IC region 1200 and the buffer 1220 receives the second IC driving information IIC2.

The power clamp circuit 1211 may detect the electrostatic discharge current and apply the detection signal DS generated by detecting the electrostatic discharge current to the error correction code calculator 1230 and the external memory device 1110. In an embodiment, the power clamp circuit 1211 may apply the detection signal DS to the error correction code calculator 1230 and the external memory device 1110 through the detection signal generator 1260.

In an embodiment, for example, the power clamp circuit 1211 may include a detector 1212 that detects the electrostatic discharge current, a discharger 1214 that provides a discharge path for the electrostatic discharge current, and a control circuit 1213 that controls the discharger 1214. The detector 1212 may include a fourth resistor R4 including a first electrode that receives the first memory voltage MV and a second electrode connected to a second capacitor C2, and the second capacitor C2 including a first electrode connected to the second electrode of the fourth resistor R4 and a second electrode that receives the second memory voltage MGND. The discharger may include a discharge transistor DCT including a control electrode connected to the control circuit 1213, a first electrode that receives the first memory voltage MV, and a second electrode that receives the second memory voltage MGND. The control circuit 1213 may include an inverter INV including a first electrode connected to the first electrode of the second capacitor C2 and a second electrode connected to the control electrode of the discharge transistor DCT. The detection signal generator 1260 may include an AND logic circuit including a first input terminal that receives a high voltage VH having a high voltage level, a second input terminal connected to the second electrode of the inverter INV, and an output terminal connected to the error correction code calculator 1230.

In an embodiment, for example, where the first memory voltage MV has the high voltage level and the second memory voltage MGND has a low voltage level, when the electrostatic discharge current is applied to a line to which the second memory voltage MGND is applied, the voltage of the first electrode of the second capacitor C2 may have the low voltage level. Accordingly, the high voltage level may be applied to the output terminal of the inverter INV.

The AND logic circuit may output the detection signal DS having a value of 1 to the error correction code calculator 1230 and the external memory device 1110 by applying the high voltage level to the second input terminal of the AND logic circuit. Also, the discharge transistor DCT may be turned on to discharge the electrostatic discharge current (i.e., the discharge transistor DCT may provide the discharge path). Accordingly, the power clamp circuit 1211 may not only detect the electrostatic discharge current generated in the internal memory device 1210, but may also discharge the electrostatic discharge current generated in the internal memory device 1210.

Figure 9:
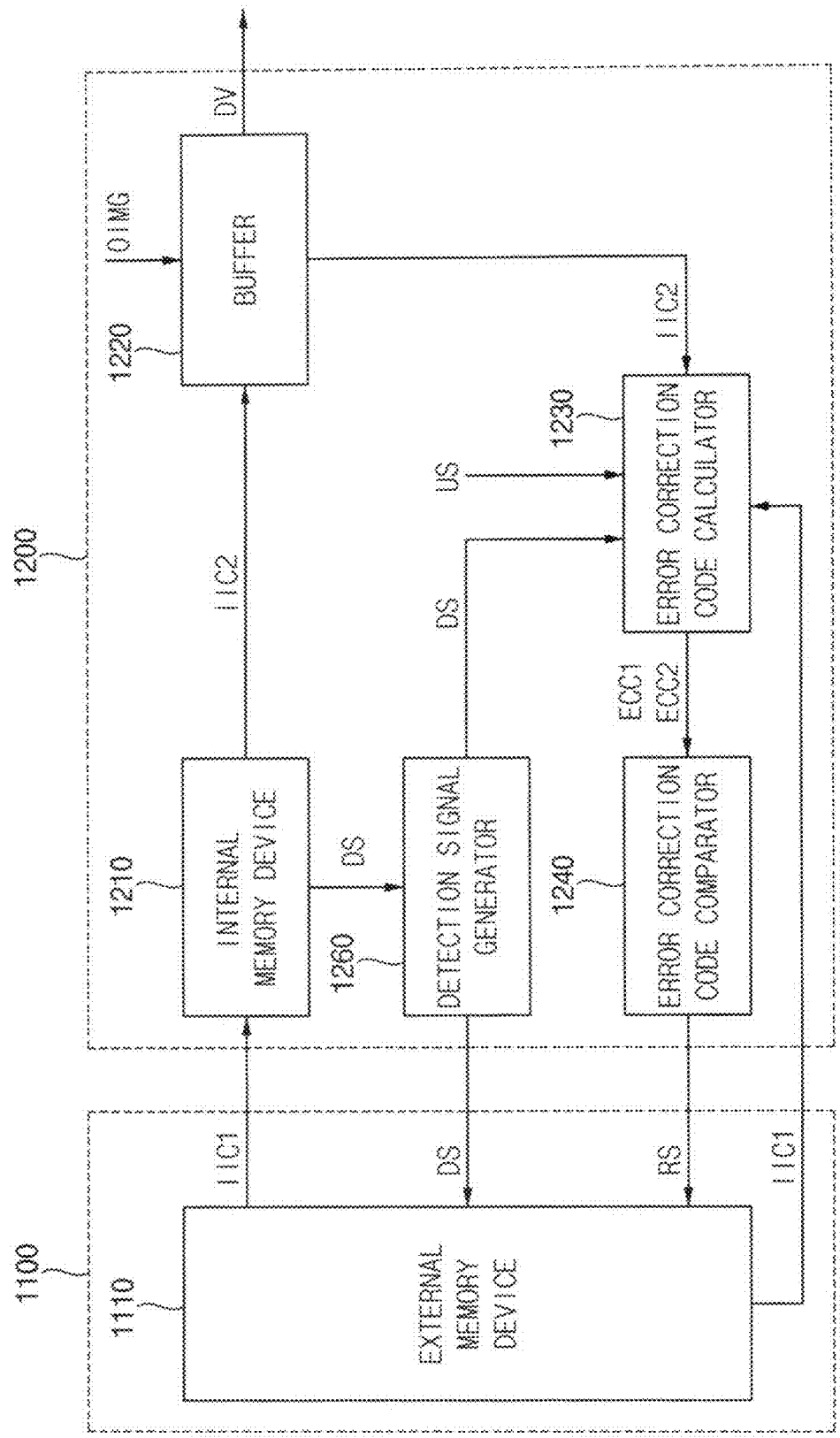
FIG. 9 is a block diagram illustrating an embodiment of a printed circuit board region and an IC region of a display device according to the invention.

FIG. 9 is a block diagram illustrating an embodiment of a printed circuit board region and an IC region of a display device according to the invention.

The display device of FIG. 9 is substantially the same as the display device of FIG. 7 except for an operation by the update signal US. Thus, the same reference numerals are used to refer to the same or similar element, and any repetitive detailed description thereof will be omitted.

Referring to FIG. 9, in an embodiment, the error correction code calculator 1230 may determine the second error correction code ECC2 when the error correction code calculator 1230 receives the update signal US from the host processor. When the error correction code calculator 1230 receives the update signal US, the error correction code calculator 1230 may determine the second error correction code ECC2 regardless of whether the electrostatic discharge current is detected. The error correction code comparator 1240 may apply the reloading signal RS to the external memory device 1110 when the first error correction code ECC1 and the second error correction code ECC2 are different from each other. That is, the display device may compare the first IC driving information IIC1 and the second IC driving information IIC2 regardless of whether the electrostatic discharge current is detected when the display device receives the update signal US from the host processor, and may update the second IC driving information IIC2 based on a result of a comparison of the first IC driving information IIC1 and the second IC driving information IIC2.

Embodiments of the inventions may be applied to any electronic device including a display device, for example, a television ("TV"), a digital TV, a three-dimensional ("3D") TV, a mobile phone, a smart phone, a tablet computer, a virtual reality ("VR") device, a wearable electronic device, a personal computer ("PC"), a home appliance, a laptop computer, a personal digital assistant ("PDA"), a portable multimedia player ("PMP"), a digital camera, a music player, a portable game console, a navigation device, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
an external memory device disposed on a printed circuit board region, wherein the external memory device stores a first integrated circuit driving information;
an internal memory device disposed in an integrated circuit region, wherein the internal memory device stores a second integrated circuit driving information generated by copying the first integrated circuit driving information;
a buffer disposed in the integrated circuit region, wherein the buffer receives the second integrated circuit driving information and detects an electrostatic discharge current;
an error correction code calculator disposed in the integrated circuit region, wherein the error correction code calculator determines a first error correction code of the first integrated circuit driving information and a second error correction code of the second integrated circuit driving information when the electrostatic discharge current is detected; and
an error correction code comparator disposed in the integrated circuit region, wherein the error correction code comparator compares the first error correction code and the second error correction code,
wherein the internal memory device selectively updates the second integrated circuit driving information to the first integrated circuit driving information based on a result of a comparison of the first error correction code and the second error correction code.

2. The display device of claim 1, further comprising:
a display panel including pixels;
a gate driver which applies gate signals to the pixels;
a data driver disposed in the integrated circuit region, wherein the data driver comprises the buffer, and to the data driver applies data voltages to the pixels; and
a driving controller disposed in the integrated circuit region, wherein the driving controller comprises the error correction code calculator and the error correction code comparator, and the driving controller controls the gate driver and the data driver.

3. The display device of claim 1, wherein the internal memory device updates the second integrated circuit driving information to the first integrated circuit driving information when the first error correction code and the second error correction code are different from each other.

4. The display device of claim 1, wherein the internal memory device updates the second integrated circuit driving information to the first integrated circuit driving information when the display device is powered on or sleeps out.

5. The display device of claim 1, wherein the error correction code calculator determines the second error correction code when the error correction code calculator receives an update signal from a host processor.

6. The display device of claim 1,
wherein the buffer includes buffer regions, and
wherein each of the buffer regions includes a buffer block which receives the second integrated circuit driving information and an electrostatic discharge detection circuit which detects the electrostatic discharge current.

7. The display device of claim 6,
wherein the error correction code calculator determines the second error correction code of the second integrated circuit driving information for a buffer region in which the electrostatic discharge current is detected among the buffer regions,
wherein the error correction code comparator compares the first error correction code of the first integrated circuit driving information for the buffer region in which the electrostatic discharge current is detected and the second error correction code of the second integrated circuit driving information for the buffer region in which the electrostatic discharge current is detected, and
wherein the internal memory device updates the second integrated circuit driving information for the buffer region in which the electrostatic discharge current is detected to the first integrated circuit driving information for the buffer region in which the electrostatic discharge current is detected when the first error correction code of the first integrated circuit driving information for the buffer region in which the electrostatic discharge current is detected and the second error correction code of the second integrated circuit driving information for the buffer region in which the electrostatic discharge current is detected are different from each other.

8. The display device of claim 6, wherein the electrostatic discharge detection circuit comprises:
a first resistor including a first electrode which receives a first memory voltage applied to the internal memory device and a second electrode connected to a first capacitor;
a second resistor including a first electrode connected to the first capacitor and a second electrode which receives a second memory voltage applied to the internal memory device;
the first capacitor including a first electrode connected to the second electrode of the first resistor and a second electrode connected to the first electrode of the second resistor;
a third resistor including a first electrode connected to the first electrode of the second resistor and a second electrode connected to a comparator; and
the comparator including a first input terminal connected to the third resistor, a second input terminal which receives an analog voltage, and an output terminal connected to the error correction code calculator.

9. The display device of claim 6, wherein the error correction code calculator determines the second error correction code of the second integrated circuit driving information for a buffer region determined based on an update signal among the buffer regions when the update signal is received from the host processor.

10. The display device of claim 1,
wherein the buffer includes a first buffer region, a second buffer region, and a third buffer region,
wherein the first buffer region includes a first buffer block and a first electrostatic discharge detection circuit adjacent to the first buffer block and the second buffer block,
wherein the second buffer region includes the second buffer block adjacent to the first buffer block and a second electrostatic discharge detection circuit adjacent to the second buffer block, and
wherein the third buffer region includes a third buffer block adjacent to the second buffer block and a third electrostatic discharge detection circuit adjacent to the second buffer block and the third buffer block.

11. The display device of claim 10, wherein the error correction code calculator determines the second error correction code of the second integrated circuit driving information for each of the first buffer region and the second buffer region when the electrostatic discharge current is detected in the first buffer region, determines the second error correction code of the second integrated circuit driving information for the second buffer region when the electrostatic discharge current is detected in the second buffer region, and determines the second error correction code of the second IC driving information for each of the second buffer region and the third buffer region when the electrostatic discharge current is detected in the third buffer region.

12. The display device of claim 1, wherein the error correction code calculator comprises:
a time delay buffer which receives a detection signal from the buffer and delays the detection signal; and
an error correction code calculating circuit which receives the detection signal from the time delay buffer and determines the first error correction code of the first integrated circuit driving information and the second error correction code of the second integrated circuit driving information in respond to the detection signal.

13. The display device of claim 1,
wherein the first error correction code is a checksum value of the first integrated circuit driving information, and
wherein the second error correction code is a checksum value of the second integrated circuit driving information.

14. A display device comprising:
an external memory device disposed on a printed circuit board region, wherein the external memory device stores a first integrated circuit driving information;
an internal memory device disposed in an integrated circuit region, wherein the internal memory device stores a second integrated circuit driving information generated by copying the first integrated circuit driving information, and the internal memory device comprises a power clamp circuit which detects an electrostatic discharge current;
a buffer disposed in the integrated circuit region, wherein the buffer receives the second integrated circuit driving information;
an error correction code calculator disposed in the integrated circuit region, wherein the error correction code determines a first error correction code of the first integrated circuit driving information and a second error correction code of the second integrated circuit driving information when the electrostatic discharge current is detected; and
an error correction code comparator disposed in the integrated circuit region, wherein the error correction code compares the first error correction code and the second error correction code,
wherein the internal memory device selectively updates the second integrated circuit driving information to the first integrated circuit driving information based on a result of a comparison of the first error correction code and the second error correction code.

15. The display device of claim 14, wherein the power clamp circuit comprises:
a detector which detects the electrostatic discharge current;
a discharger which provides a discharge path for the electrostatic discharge current; and
a control circuit which controls the discharger.

16. The display device of claim 15, wherein the detector comprises:
a fourth resistor including a first electrode which receives a first memory voltage applied to the internal memory device and a second electrode connected to a second capacitor; and
the second capacitor including a first electrode connected to the second electrode of the fourth resistor and a second electrode which receives a second memory voltage applied to the internal memory device,
wherein the discharger comprises a discharge transistor including a control electrode connected to the control circuit, a first electrode which receives the first memory voltage, and a second electrode which receives the second memory voltage, and
wherein the control circuit comprises an inverter including a first electrode connected to the first electrode of the second capacitor and a second electrode connected to the control electrode of the discharge transistor.

17. The display device of claim 14, wherein the internal memory updates the second integrated circuit driving information to the first integrated circuit driving information when the first error correction code and the second error correction code are different from each other.

18. The display device of claim 14, wherein the internal memory device updates the second integrated circuit driving information to the first integrated circuit driving information when the display device is powered on or sleeps out.

19. The display device of claim 14, wherein the error correction code calculator determines the second error correction code when the error correction code calculator receives an update signal from a host processor.

20. The display device of claim 14,
wherein the first error correction code is a checksum value of the first integrated circuit driving information, and
wherein the second error correction code is a checksum value of the second IC driving information.

* * * * *